(12) United States Patent
Namai

(10) Patent No.: US 9,330,762 B2
(45) Date of Patent: May 3, 2016

(54) SEMICONDUCTOR MEMORY DEVICE

(71) Applicant: Yuzuru Namai, Kawasaki (JP)

(72) Inventor: Yuzuru Namai, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 97 days.

(21) Appl. No.: 13/625,392

(22) Filed: Sep. 24, 2012

(65) Prior Publication Data

US 2013/0135931 A1 May 30, 2013

(30) Foreign Application Priority Data

Nov. 25, 2011 (JP) ................. 2011-257298

(51) Int. Cl.
*G11C 11/42* (2006.01)
*G11C 16/04* (2006.01)
*G11C 16/10* (2006.01)
*G11C 16/34* (2006.01)

(52) U.S. Cl.
CPC ............ *G11C 16/0483* (2013.01); *G11C 16/10* (2013.01); *G11C 16/3418* (2013.01)

(58) Field of Classification Search
CPC . G11C 16/0483; G11C 16/10; G11C 16/3418
USPC ................................................... 365/185.11
See application file for complete search history.

(56) References Cited

U.S. PATENT DOCUMENTS

| | | | | |
|---|---|---|---|---|
| 4,636,982 A | * | 1/1987 | Takemae et al. | 365/149 |
| 6,031,764 A | * | 2/2000 | Imamiya | G11C 16/0483 365/185.11 |
| 6,404,661 B2 | * | 6/2002 | Hidaka | 365/63 |
| 2003/0214844 A1 | * | 11/2003 | Iijima | 365/185.21 |
| 2007/0206419 A1 | | 9/2007 | Makino | |
| 2009/0073763 A1 | * | 3/2009 | Hosono | G11C 11/5642 365/185.03 |
| 2009/0225599 A1 | * | 9/2009 | Futatsuyama | G11C 16/10 365/185.11 |

FOREIGN PATENT DOCUMENTS

| | | |
|---|---|---|
| JP | 2004-280867 | 10/2004 |
| JP | 2011-44222 | 3/2011 |

* cited by examiner

*Primary Examiner* — Shawki S Ismail
*Assistant Examiner* — Muhammad Islam
(74) *Attorney, Agent, or Firm* — Oblon, McClelland, Maier & Neustadt, L.L.P.

(57) ABSTRACT

According to one embodiment, a semiconductor memory device includes a first memory cell array including a first block that includes memory cells, a second memory cell array including a second block that includes memory cells, word lines arranged in the first and second memory cell arrays, and a row decoder including transfer gates that respectively transfer voltages to the word lines. Word lines arranged in the first block include first and second groups, word lines arranged in the second block include third and fourth groups, and the first and third groups commonly use the transfer gates.

16 Claims, 10 Drawing Sheets

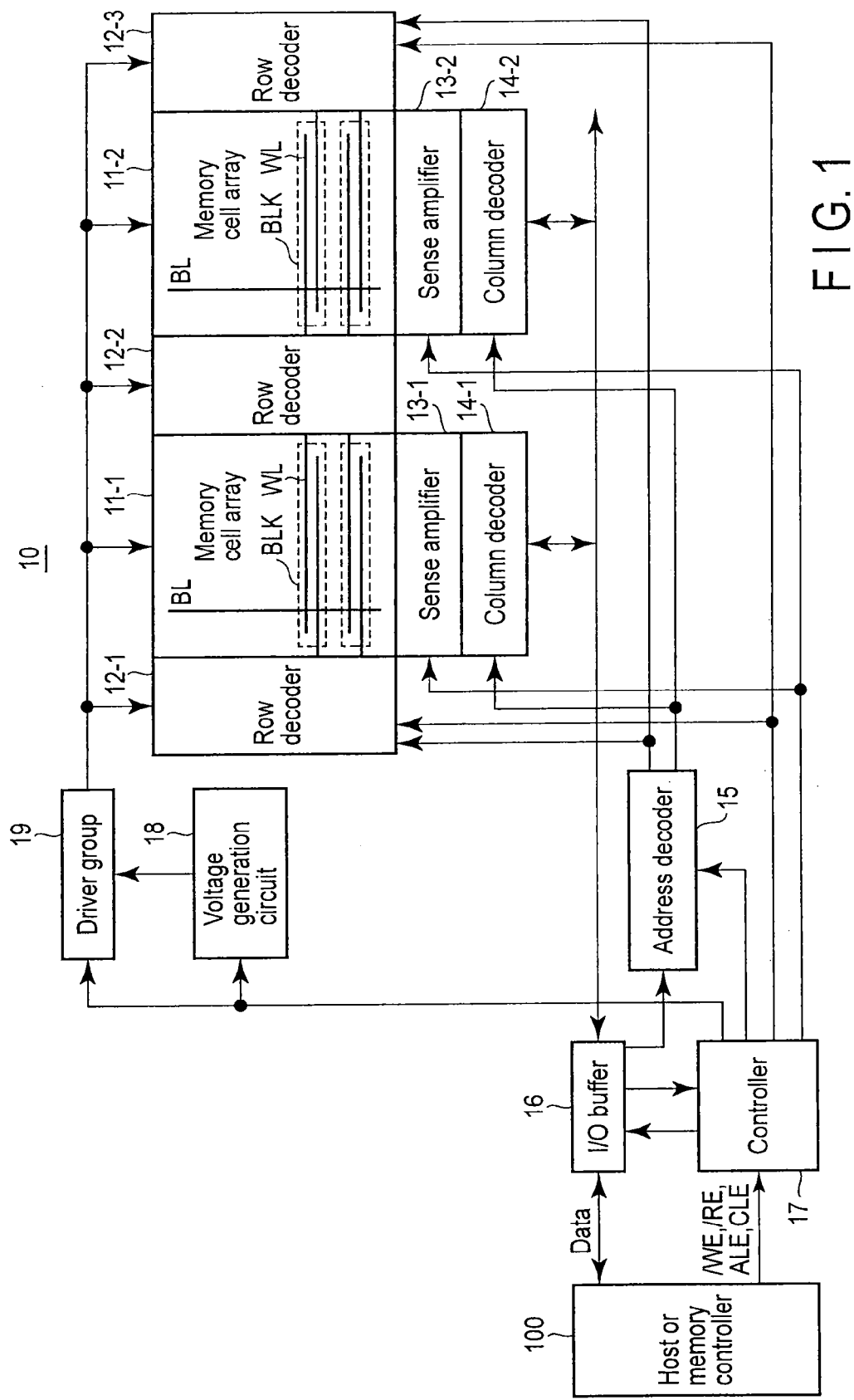
F I G. 1

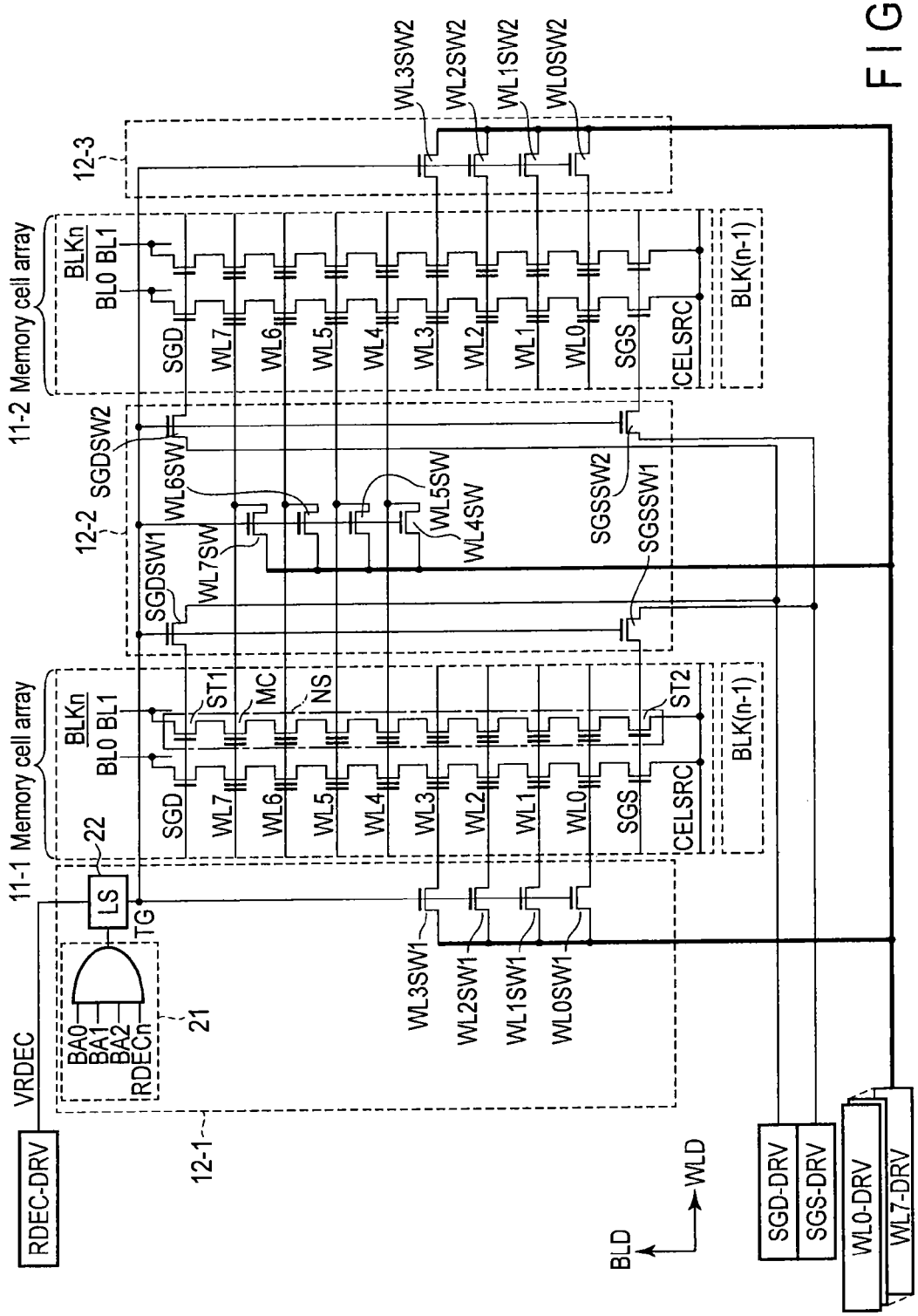
F I G. 2

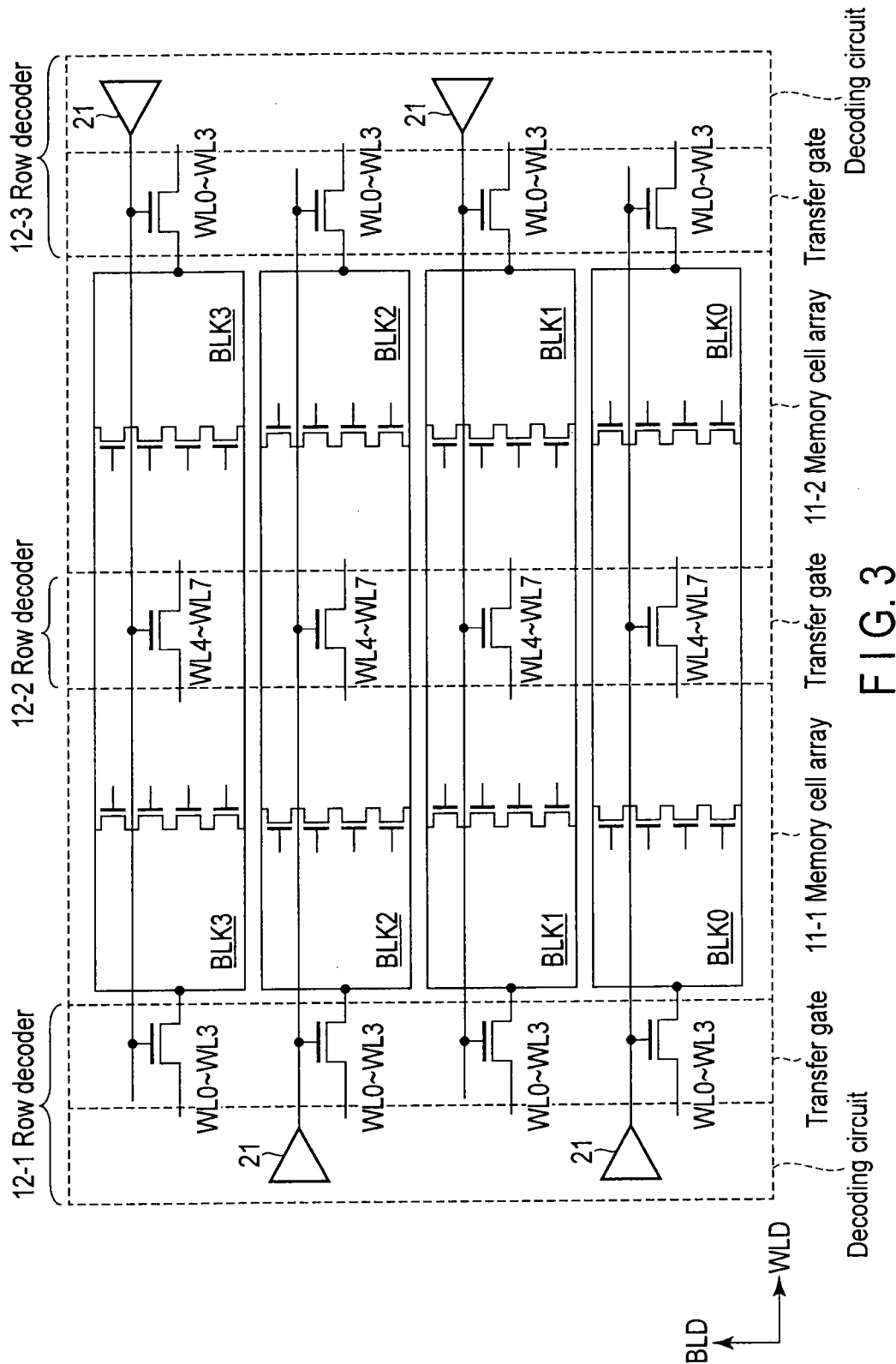
F I G. 3

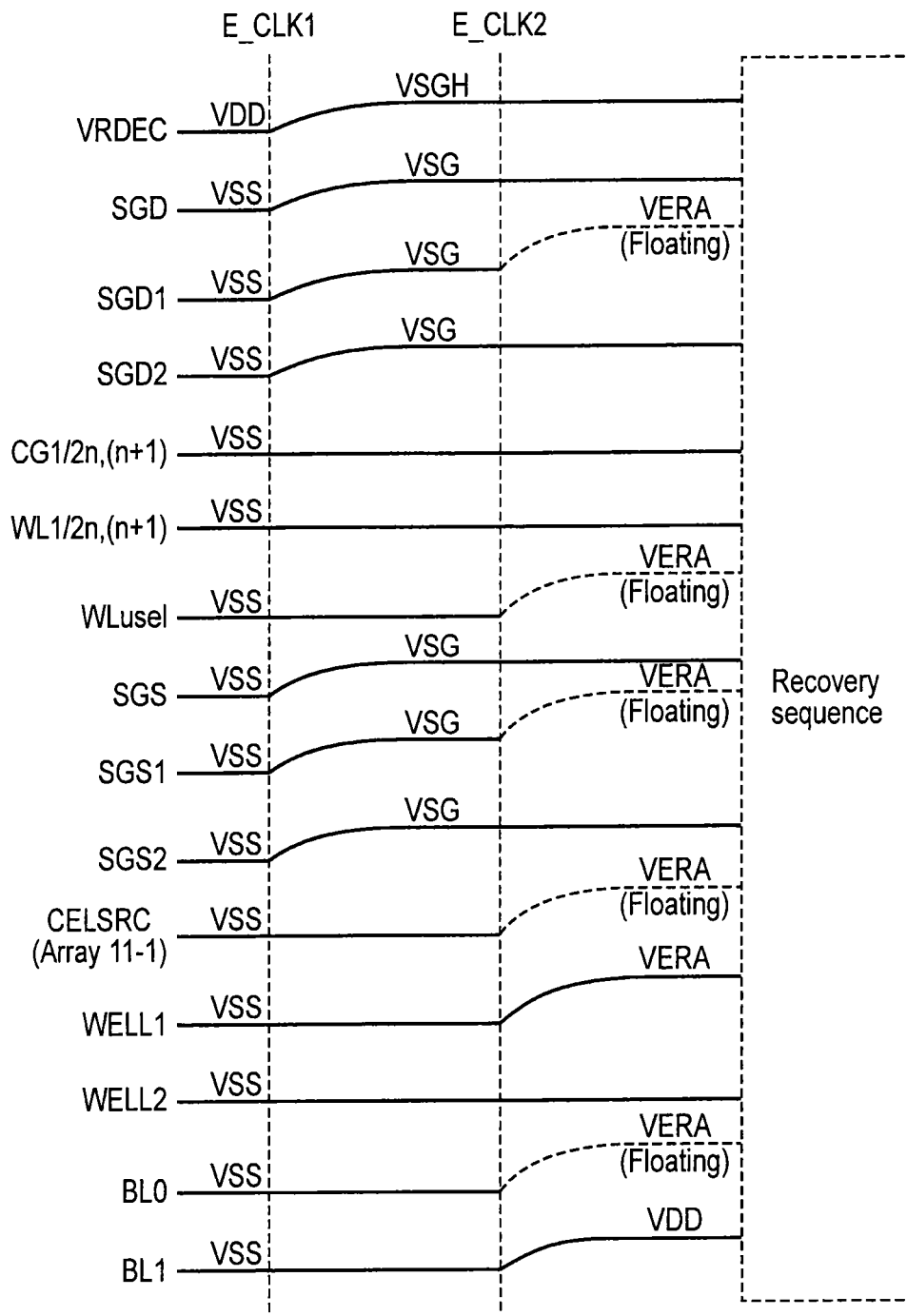
F I G. 8

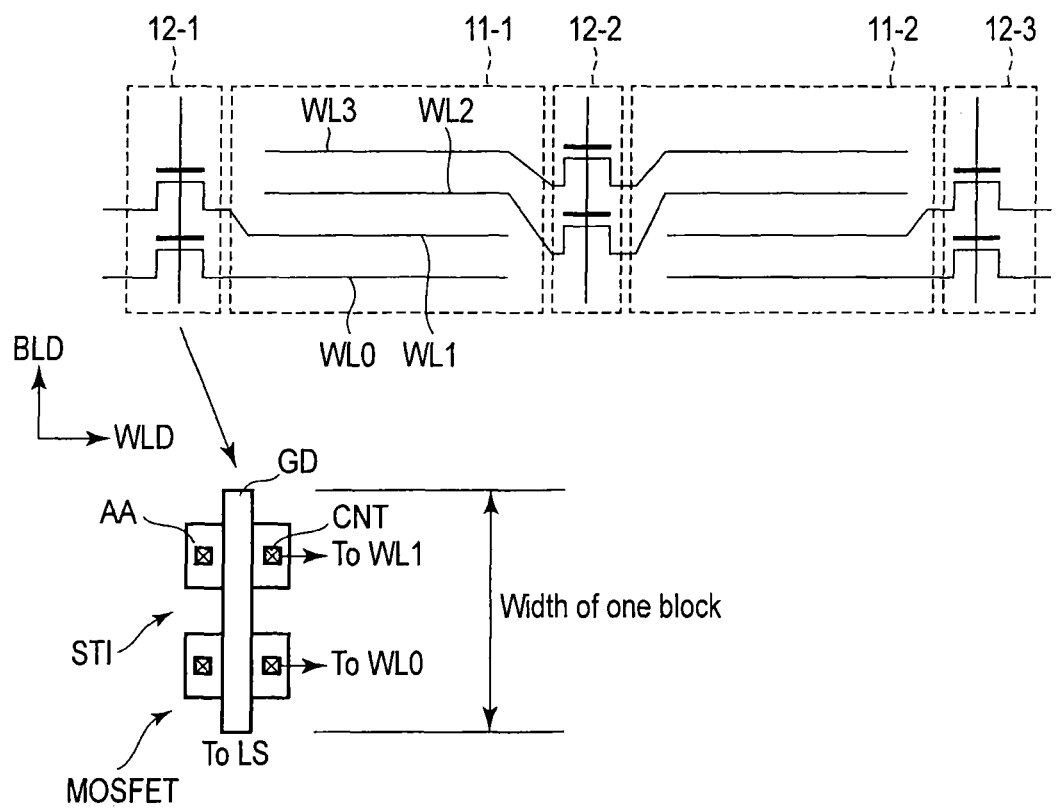
F I G. 10

SEMICONDUCTOR MEMORY DEVICE

CROSS-REFERENCE TO RELATED APPLICATIONS

This application is based upon and claims the benefit of priority from Japanese Patent Application No. 2011-257298, filed Nov. 25, 2011, the entire contents of which are incorporated herein by reference.

FIELD

Embodiments described herein relate generally to a semiconductor memory device.

BACKGROUND

A NAND flash memory is known as one type of a nonvolatile semiconductor memory device. The NAND flash memory comes to be used in various electronic devices and it is desired to reduce the manufacturing cost and enhance the yield thereof. Therefore, recently, reducing of the manufacturing process and a device for shrink of the circuit scale are daily studied as the elemental technique.

The NAND flash memory includes a memory cell array having a plurality of electrically rewritable EEPROM cells arranged in a matrix form and a row decoder that transfers voltages to a plurality of word lines arranged in the memory cell array. The memory cell array is configured by a plurality of blocks that are data erase units.

Row decoders may be arranged on both sides of the memory cell array in some cases. Since the row decoder transfers various high voltages to the word lines, large-size MOSFETs are used. Therefore, the circuit area of the row decoder becomes larger and, as a result, the circuit area of the NAND flash memory increases.

BRIEF DESCRIPTION OF THE DRAWINGS

FIG. 1 is a block diagram showing the configuration of a nonvolatile semiconductor memory device according to the present embodiment;

FIG. 2 is a circuit diagram showing the configurations of memory cell arrays and row decoders shown in FIG. 1;

FIG. 3 is a schematic diagram of the row decoders;

FIG. 8 is a timing diagram for illustrating the erase operation;

FIG. 10 is a schematic diagram showing the layout of MOS transistors for transfer gates.

DETAILED DESCRIPTION

Figure 4:
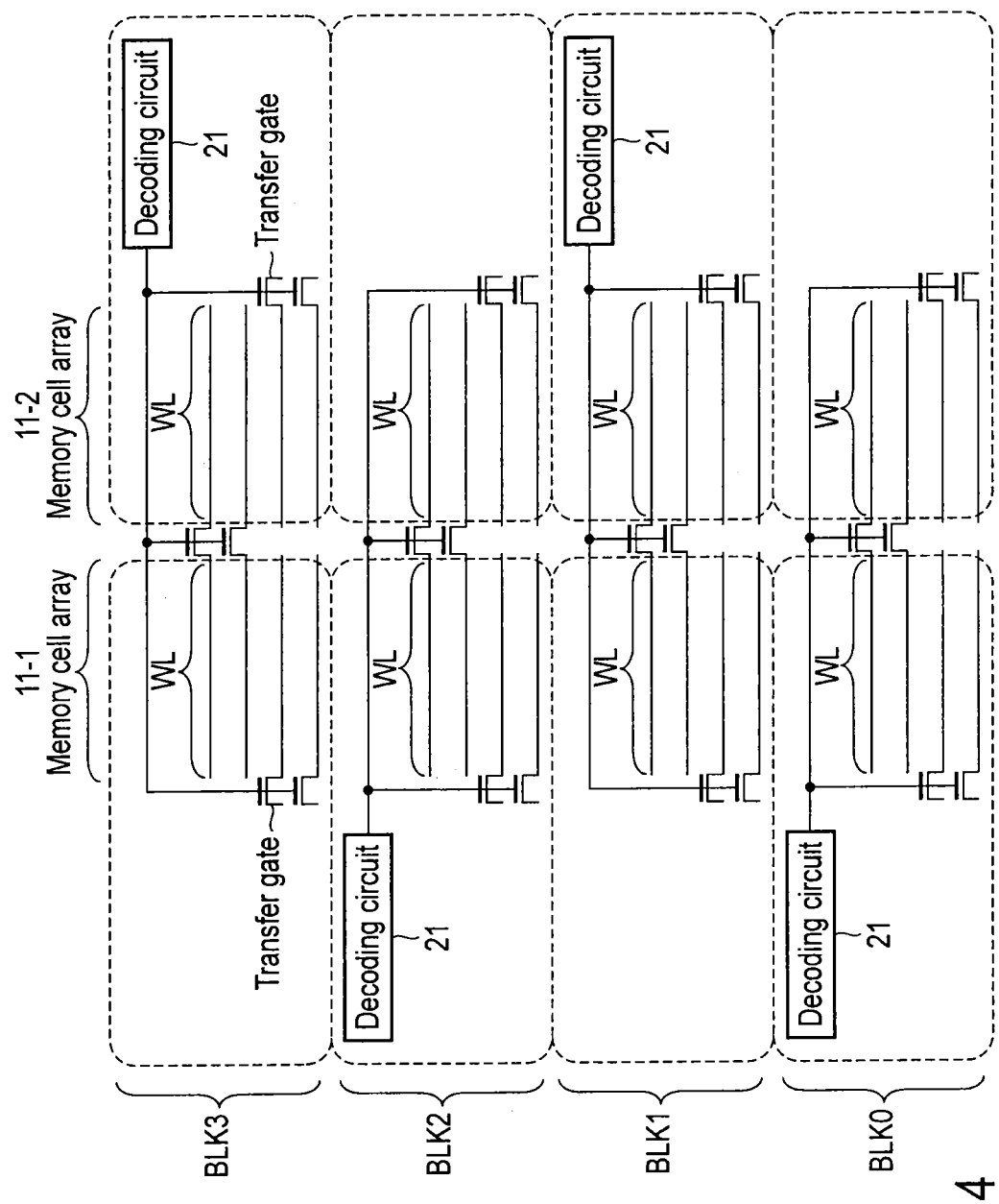
FIG. 4 is a schematic diagram for illustrating the relationship between the number of word lines and the number of transfer gates.

In general, according to one embodiment, there is provided a semiconductor memory device comprising:

a first memory cell array including a first block that includes memory cells;

a second memory cell array including a second block that includes memory cells;

word lines arranged in the first and second memory cell arrays; and a row decoder including transfer gates that respectively transfer voltages to the word lines, wherein word lines arranged in the first block include first and second groups, word lines arranged in the second block include third and fourth groups, and the first and third groups commonly use the transfer gates.

The embodiments will be described hereinafter with reference to the accompanying drawings. In the description which follows, the same or functionally equivalent elements are denoted by the same reference numerals, to thereby simplify the description.

[1. Configuration of Nonvolatile Semiconductor Memory Device 10]

FIG. 1 is a block diagram showing the configuration of a nonvolatile semiconductor memory device 10 according to the present embodiment. In this embodiment, as the nonvolatile semiconductor memory device 10, a NAND flash memory is provided as an example and explained.

The nonvolatile semiconductor memory device 10 includes a plurality of memory cell arrays 11. In other words, one memory cell array 11 is divided into a plurality of memory cell arrays (that are hereinafter referred to as a plurality of planes in some cases). In this embodiment, an example in which two memory cell arrays 11-1 and 11-2 are provided is explained. In the following explanation, if the memory cell array is simply expressed as the memory cell array 11, one of the memory cell arrays 11-1 and 11-2 is indicated and the memory cell arrays 11-1 and 11-2 are not specifically distinguished.

The memory cell array 11 has a plurality of memory cells arranged in a matrix form. The memory cell includes an electrically rewritable EEPROM cell. In the memory cell array 11, a plurality of bit lines BL, a plurality of word lines WL and source line CELSRC are arranged to control voltages of the memory cells. Individual bit lines BL and word lines WL are provided in each of the memory cell arrays 11-1 and 11-2.

Further, the memory cell arrays 11-1 and 11-2 respectively formed in wells that are electrically isolated.

Row decoders 12-1 to 12-3 are connected to word lines WL to select and drive word lines WL. Further, the row decoder 12-1 drives word lines WL of the memory cell array 11-1. The row decoder 12-3 drives word lines WL of the memory cell array 11-2. The row decoder 12-2 provided between the memory cell arrays 11-1 and 11-2 is commonly used by the memory cell arrays 11-1 and 11-2 to drive word lines WL of the memory cell arrays 11-1 and 11-2.

Sense amplifiers 13-1 and 13-2 are connected to bit lines BL of the respective memory cell arrays 11-1 and 11-2. The sense amplifier 13-1 detects data of bit lines BL at the data read time, controls voltages of bit lines BL according to write data at the data write time and controls voltages of bit lines BL at the data erase time with respect to the memory cell array 11-1. Also, the sense amplifier 13-2 is configured to perform the same operation as the sense amplifier 13-1 with respect to the memory cell array 11-2.

Column decoders 14-1 and 14-2 generate column selection signals used to select bit lines BL of the memory cell arrays 11-1 and 11-2 according to an address supplied from an address decoder 15 and supply the column selection signals to the sense amplifiers 13-1 and 13-2.

An input/output buffer (I/O buffer) 16 receives data (including a command, address and write data) from the exterior (for example, a host or memory controller 100). Further, the I/O buffer 16 transfers a command to a controller 17, supplies an address to the address decoder 15 and transfers write data to the sense amplifiers 13-1 and 13-2. Also, the I/O buffer 16 outputs read data read from the memory cell arrays 11-1 and 11-2 by means of the sense amplifiers 13-1 and 13-2 to the exterior.

The address decoder 15 decodes an address transferred from the I/O buffer 16, transfers a column address to the column decoders 14-1 and 14-2 and transfers a row address to the row decoders 12-1 to 12-3.

The controller 17 receives external control signals such as a write enable signal /WE, read enable signal /RE, address latch enable signal ALE and command latch enable signal CLE from the exterior. The controller 17 generates control signals that control sequences of data read, data write and data erase based on the external control signal and command. The controller 17 collectively controls various operations of the nonvolatile semiconductor memory device 10 by use of the control signals.

A voltage generation circuit 18 generates voltages for the operations of the memory cell array 11, row decoder 12 and sense amplifier 13, for example, a read voltage, write voltage, verify voltage, erase voltage and the like according to a control signal supplied from the controller 17.

A driver group 19 is configured by a plurality of drivers DRV that will be described later. The driver group 19 receives various voltages from the voltage generation circuit 18 and supplies various voltages at preset timings to the memory cell arrays 11, row decoders 12 and sense amplifiers 13 according to a control signal supplied from the controller 17.

FIG. 2 is a circuit diagram showing the configurations of the memory cell arrays 11 and row decoders 12 shown in FIG. 1.

The memory cell array 11 includes a plurality of blocks BLK. Each block BLK is the data erase unit. Blocks BLK are arranged side by side in bit line direction BLD. In FIG. 2, only two blocks BLK(n−1) and BLKn are extracted and shown.

Each block BLK includes a plurality of NAND strings NS. NAND strings NS are arranged side by side in word line direction WLD. Each NAND string NS includes a plurality of memory cells MC (that are also referred to as memory cell transistors) and two select transistors ST1 and ST2. In this embodiment, two NAND strings NS are extracted and shown and, for easy understanding, it is supposed that each NAND string NS includes eight memory cells MC. As select transistors ST1 and ST2, for example, N-channel MOSFETs (Metal Oxide Semiconductor Field Effect Transistors) are used.

Memory cell MC has a stacked gate structure including a charge storage layer (for example, a floating gate electrode) formed above a semiconductor substrate (well) with a gate insulating film disposed therebetween and a control gate electrode formed above the charge storage layer with an intergate insulating film disposed therebetween. Memory cell MC is not limited to the floating gate structure and can be formed with a MONOS (Metal Oxide Nitride Oxide Silicon) structure using a system in which electrons are trapped in an insulating film (for example, nitride film) used as a charge storage layer. For example, memory cell MC can store one-bit data according to a variation in the threshold voltage due to an amount of electrons injected into the charge storage layer.

The current paths of memory cells MC that are adjacent in the NAND string are serially connected. One end of series-connected memory cells MC is connected to the source of select transistor ST1 and the other end thereof is connected to the drain of select transistor ST2.

Each of the control gate electrodes of memory cells MC on the same row extends in word line direction WLD and is commonly connected to memory cells MC arranged side by side in word line direction WLD. Each control gate electrode is used as one of word lines WL0 to WL8. Likewise, each of the gate electrodes of select transistors ST1 (or ST2) arranged side by side in word line direction WLD extends in word line direction WLD and is commonly connected to select transistors ST1 (or ST2). Each gate electrode is used as select gate line SGD (or SGS). The drain of each select transistor ST1 is connected to a corresponding one of bit lines BL. The sources of select transistors ST2 are commonly connected to source line CELSRC.

Memory cells MC connected to the same word line WL configure one page. Data write and read are simultaneously performed with respect to memory cells MC in one page. Further, the memory cell array 11 is configured to simultaneously erase data of a plurality of pages and the erase unit is block BLK. All of the blocks of the memory cell array 11-1 may be formed in a common well and all of the blocks of the memory cell array 11-2 can be formed in a common well. Further, the wells of the memory cell arrays 11-1 and 11-2 are electrically isolated.

Bit line BL may commonly connect the drains of select transistors ST1 of blocks BLK. That is, NAND strings NS lying on the same column in blocks BLK(n−1) and BLKn may be connected to the same bit line BL.

(Configuration of Row Decoders 12-1 to 12-3)

Next, the configuration of the row decoders 12-1 to 12-3 is explained. In FIG. 2, the configuration of the row decoders 12-1 to 12-3 in a portion corresponding to two blocks BLKn included in the memory cell arrays 11-1 and 11-2 is shown. Therefore, in practice, the row decoders 12 of FIG. 2 corresponding in number to blocks BLK are arranged side by side in bit line direction BLD. Various drivers DRV (such as RDEC-DRV, SGD-DRV or the like) shown in FIG. 2 are included in the driver group 19 of FIG. 1. The "number of blocks" is the number of blocks of the memory cell array 11-1 or 11-2.

The row decoder 12-1 includes a decoding circuit 21, level shifter (LS) 22 and transfer gates WL0SW1 to WL3SW1 for word lines WL0 to WL3 of the memory cell array 11-1. For example, the transfer gate is configured by an N-channel MOSFET. The decoding circuits 21 and level shifters (LS) 22 corresponding in number to blocks BLK are prepared.

For example, the decoding circuit 21 receives block addresses BA (including BA0 to BA2) and row decoder selection address RDECn from the address decoder 15. The row decoder 21 performs a selection operation of block BLKn by use of the above addresses.

The level shifter 22 is connected to row decoder driver RDEC-DRV via signal line VRDEC. The level shifter 22 generates transfer signal TG obtained by raising the voltage level of voltage VRDEC supplied from row decoder driver RDEC-DRV when a signal from the decoding circuit 21 is activated.

The drains of transfer gates WL0SW1 to WL3SW1 are respectively connected to drivers WL0-DRV to WL3-DRV for word lines WL0 to WL3. The sources of transfer gates WL0SW1 to WL3SW1 are respectively connected to word lines WL0 to WL3 of the memory cell array 11-1.

Transfer signal TG is input to the gates of transfer gates WL0SW1 to WL3SW1.

The row decoder 12-2 is commonly used by the memory cell arrays 11-1 and 11-2. The row decoder 12-2 includes transfer gates WL4SW to WL7SW for word lines WL4 to WL7 of the memory cell arrays 11-1 and 11-2, transfer gates SGDSW1 and SGSSW1 for select gate lines SGD and SGS of the memory cell array 11-1, and transfer gates SGDSW2 and SGSSW2 for select gate lines SGD and SGS of the memory cell array 11-2. Transfer gate SGDSW1 and transfer gate SGDSW2 may be commonly used. Further, transfer gate SGSSW1 and transfer gate SGSSW2 can also be commonly used. As a result, the circuit area can be reduced.

The drains of transfer gates WL4SW to WL7SW are respectively connected to drivers WL4-DRV to WL7-DRV for word lines WL4 to WL7. The sources of transfer gates WL4SW to WL7SW are respectively connected to word lines WL4 to WL7 of the memory cell arrays 11-1 and 11-2. Transfer signal TG is input to the gates of transfer gates WL4SW to WL7SW.

The drains of transfer gates SGDSW1 and SGSSW1 are respectively connected to drivers SGD-DRV and SGS-DRV for select gate lines SGD and SGS. The sources of transfer gates SGDSW1 and SGSSW1 are respectively connected to select gate lines SGD and SGS of the memory cell array 11-1. Transfer signal TG is input to the gates of transfer gates SGDSW1 and SGSSW1.

The drains of transfer gates SGDSW2 and SGSSW2 are respectively connected to drivers SGD-DRV and SGS-DRV for select gate lines SGD and SGS. The sources of transfer gates SGDSW2 and SGSSW2 are respectively connected to select gate lines SGD and SGS of the memory cell array 11-2. Transfer signal TG is input to the gates of transfer gates SGDSW2 and SGSSW2. In FIG. 2, the same transfer signal TG is input to the gates of transfer gates WL4SW to WL7SW and the gates of transfer gates SGDSW1, SGSSW1, SGDSW2 and SGSSW2 for convenience, but the voltage of transfer signal TG may be set to different values.

Further, transfer gates SGDSW1 and SGSSW1 for select gate lines SGD and SGS of the memory cell array 11-1 and transfer gates SGDSW2 and SGSSW2 for select gate lines SGD and SGS of the memory cell array 11-2 are not necessarily arranged in the row decoder 12-2. The above transfer gates may be arranged in the row decoder 12-2 or 12-3. Further, the transfer gates may be arranged in different row decoders 12.

The row decoder 12-3 includes transfer gates WL0SW2 to WL3SW2 for word lines WL0 to WL3 of the memory cell array 11-2. The drains of transfer gates WL0SW2 to WL3SW2 are respectively connected to drivers WL0-DRV to WL3-DRV for word lines WL0 to WL3. The sources of transfer gates WL0SW2 to WL3SW2 are respectively connected to word lines WL0 to WL3 of the memory cell array 11-2. Transfer signal TG is input to the gates of transfer gates WL0SW2 to WL3SW2.

In brief, word lines WL arranged in block BLKn of the memory cell array 11-1 are divided into a first group (word lines WL0 to WL3) and second group (word lines WL4 to WL7). Word lines WL0 to WL3 of the first group are connected to the row decoder 12-1 and word lines WL4 to WL7 of the second group are connected to the row decoder 12-2. Word lines WL arranged in block BLKn of the memory cell array 11-2 are divided into a third group (word lines WL0 to WL3) and fourth group (word lines WL4 to WL7). Word lines WL0 to WL3 of the third group are connected to the row decoder 12-3 and word lines WL4 to WL7 of the fourth group are connected to the row decoder 12-2.

In order to avoid the drawing from becoming complicated, drivers DRV and the transfer gates in FIG. 2 are connected via thick lines that indicate a plurality of interconnections provided for the respective transfer gates. Therefore, word line drivers WL0-DRV to WL7-DRV can transfer different voltages for the respective transfer gates. Word line drivers WL0-DRV to WL7-DRV are word line drivers corresponding to word lines WL0 to WL7 of respective blocks BLK. Further, the layout of interconnections can be made simple by arranging transfer gates SGDSW1 and SGSSW1 and transfer gates SGDSW2 and SGSSW2 in the row decoder 12-2.

As shown in FIG. 2, in this embodiment, the row decoder 12-2 between the memory cell arrays 11-1 and 11-2 is gathered in one portion and the row decoder 12-2 is commonly used by the memory cell arrays 11-1 and 11-2. Further, transfer signal TG is commonly used by the row decoders 12-1 to 12-3. Therefore, word lines WL of the same block number in the memory cell arrays 11-1 and 11-2 are simultaneously selected.

FIG. 3 is a schematic diagram of the row decoders 12-1 to 12-3. In FIG. 3, eight blocks BLK ((BLK0 to BLK3)×2) included in the memory cell arrays 11-1 and 11-2 are extracted and shown.

As is understood from FIG. 3, in this embodiment, only four decoding circuits 21 are disposed for eight blocks BLK. The four decoding circuits 21 are alternately arranged on both sides of the memory cell arrays 11-1 and 11-2. Further, transfer gates can be arranged on a line in bit line direction BLD between the memory cell arrays 11-1 and 11-2. As a result, the circuit layout can be made simple.

FIG. 4 is a schematic diagram for illustrating the relationship between the number of word lines and the number of transfer gates. As is understood from FIG. 4, half of the word lines of one block are connected to transfer gates on one side of the memory cell array per two blocks BLK. This means that a margin in the pitch of interconnections that connect the transfer gates with word lines can be doubled when the transfer gates and word lines are connected. As the transfer gate, a MOSFET formed with large size to transfer a high voltage is used. Occurrence of a short circuit between the interconnections due to shrinking of the memory cell can be suppressed by applying the structure of this embodiment.

[2. Operation]

Figure 5:
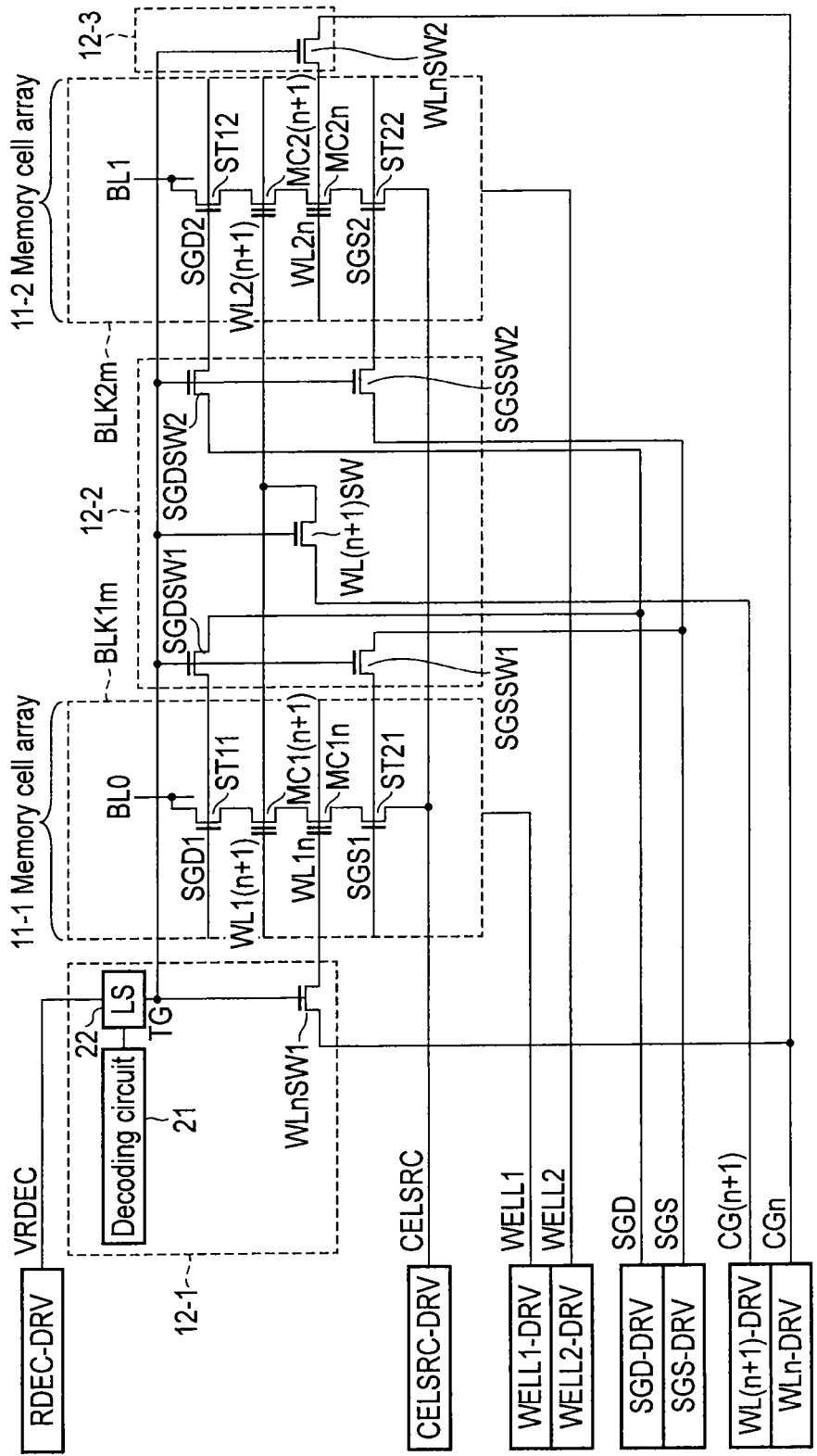
FIG. 5 is a diagram showing an extracted circuit required for explaining the operation of the nonvolatile semiconductor memory device.

Next, the operation of the nonvolatile semiconductor memory device 10 is explained. FIG. 5 is a diagram showing an extracted circuit required for explaining the operation of the nonvolatile semiconductor memory device 10. In FIG. 5, selected block BLK1$m$ in the memory cell array 11-1 selected by the decoding circuit 21 and block BLK2$m$ having the same block number as selected block BLK1$m$ in the memory cell array 11-2 are shown. In this case, block BLK1$m$ and block BLK2$m$ commonly use the row decoder 12-2 and decoding circuit 21. Further, for simplification, only word lines WLn and WL(n+1) among the word lines in block BLK are shown in the drawing.

In FIG. 5, wells of the memory cell arrays 11-1 and 11-2 are denoted by WELL1 and WELL2, select gate lines of the memory cell array 11-1 are denoted by SGD1 and SGS1, select gate lines of the memory cell array 11-2 are denoted by SGD2 and SGS2, word lines of the memory cell array 11-1 are denoted by WL1$n$ and WL1(n+1), word lines of the memory cell array 11-2 are denoted by WL2$n$ and WL2(n+1), select transistors of the memory cell array 11-1 are denoted by ST11 and ST21, and select transistors of the memory cell array 11-2 are denoted by ST12 and ST22. Further, a transfer line that connects driver WLn-DRV to transfer gates WLnSW1 and WLnSW2 is denoted by CGn and a transfer line that connects driver WL(n+1)-DRV to transfer gate WL(n+1)SW is denoted by CG(n+1). WELL1-DRV shown in FIG. 5 indicates a driver for well WELL1, WELL2-DRV indicates a driver for well WELL2 and CELSRC-DRV indicates a driver for source line CELSRC. The drivers are included in the driver group 19 of FIG. 1.

The read operation, write operation and erase operation of the nonvolatile semiconductor memory device 10 are explained below. In the read operation, write operation and erase operation, the voltages of word lines WL are controlled by the row decoders 12-1 to 12-3 under control of the controller 17 and the voltages of bit lines BL are controlled by means of the sense amplifiers 13-1 and 13-2 under control of the controller 17.

Figure 6:
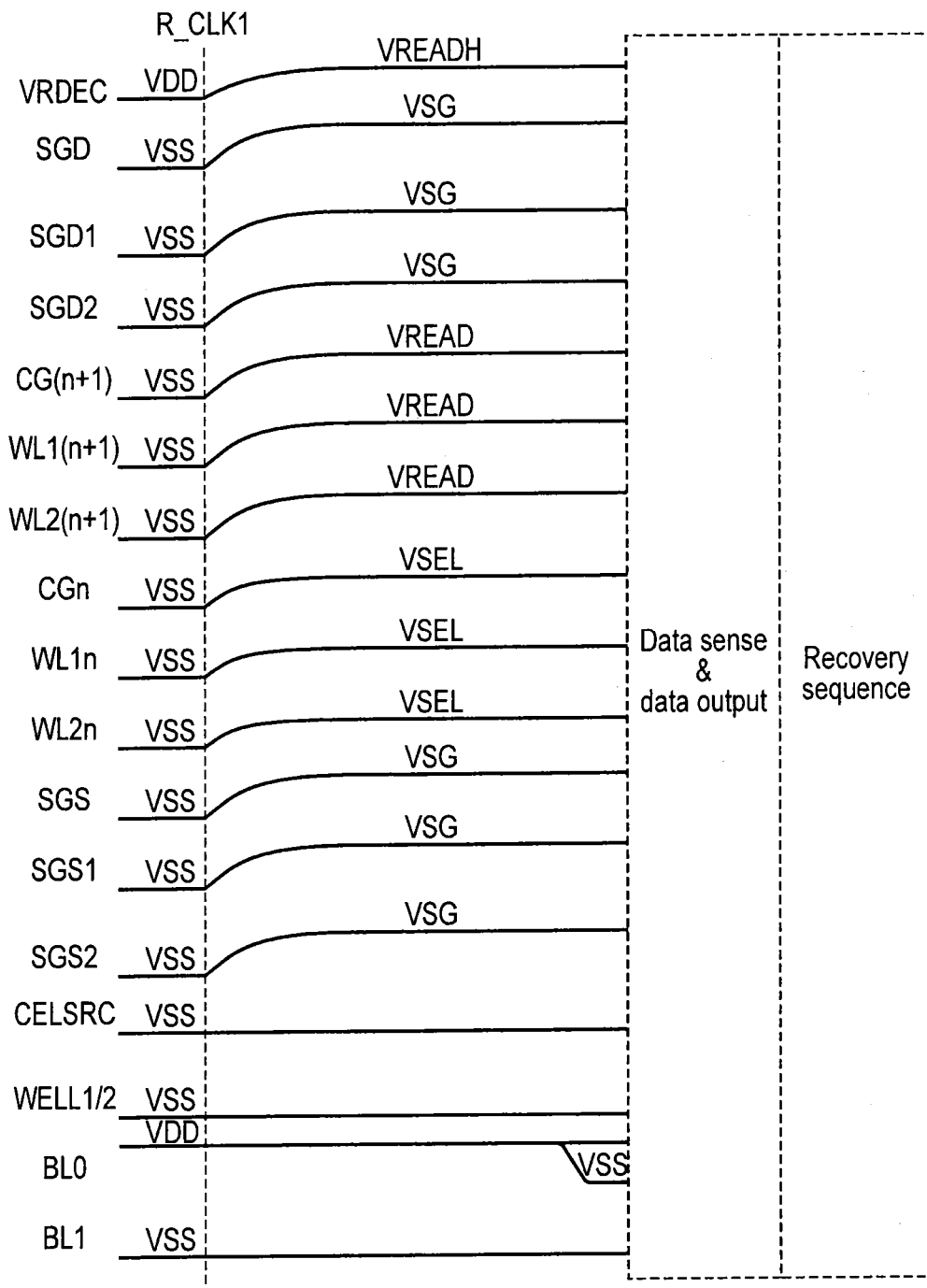
FIG. 6 is a timing diagram for illustrating the read operation.

FIG. 6 is a timing diagram for illustrating the read operation. It is supposed that word line WL1n of the memory cell array 11-1 of FIG. 5 is selected. Various voltages are generated from the voltage generation circuit 18 and are supplied to the corresponding circuits at preset timings by the driver group 19.

In FIG. 6 and in the following description, VSG is a voltage that enables the transfer gate to transfer power source voltage VDD, VREAD is a voltage that can make conductive the memory cell into which data is written, VREADH is a voltage that enables the transfer gate to transfer voltages VSG and VREAD, and VSEL is a read voltage for determining data stored in memory cell MC.

When the read operation is started in response to clock R_CLK1, voltage VREADH is applied to signal line VRDEC and transfer signal line TG. As a result, all of the transfer gates connected to blocks BLK1m and BLK2m are turned on and a state in which voltages VSG and VREAD can be transferred is set. Further, voltage VSG is applied to select gate lines SGD1 and SGS1 and select transistors ST11 and ST21 are turned on. Ground voltage VSS is applied to source line CELSRC and, for example, ground voltage VSS is applied to the node of well WELL1.

Voltage VREAD is applied to word line WL1(n+1) and memory cell MC1(n+1) connected thereto is turned on irrespective of stored data. Read voltage VSEL is applied to word line WL1n and memory cell MC1n connected thereto is turned on or off according to stored data. That is, if the threshold voltage of a memory cell that stores "1" data is lower than the threshold voltage of a memory cell that stores "0" data, memory cell MC1n applied with read voltage VSEL is turned on when "1" data is stored therein and turned off when "0" data is stored therein. As a result, for example, bit line BL0 on the side of the memory cell array 11-1 is precharged to power source voltage VDD and the bit line voltage maintains power source voltage VDD or is lowered to ground voltage VSS according to whether stored data of memory cell MC1n is "0" data or "1" data. After this, the data sense operation and data output operation are performed and a recovery sequence for returning various voltages to the initial state is performed.

In this case, since data of the memory cell array 11-2 is not read, it is not required to apply various voltages originally used for reading to block BLK2m. In this embodiment, the memory cell arrays 11-1 and 11-2 commonly use the decoding circuit 21. As a result, the memory cell arrays 11-1 and 11-2 are simultaneously selected and the same voltage as that of selected block BLK1m is transferred to block BLK2m except bit line BL. At this time, the controller 17 deactivates the sense amplifier 13-2 on the side of the memory cell array 11-2 and applies ground voltage VSS to bit line BL1 of the memory cell array 11-2 (that is, the voltage of bit line BL1 is set in a reset state). As a result, in the memory cell array 11-2, since the data sense operation and data output operation are not performed, the memory cell array 11-2 is set in substantially the same state as the non-reading state. Therefore, even when the memory cell arrays 11-1 and 11-2 are simultaneously selected, the read operation of the memory cell array 11-1 is not influenced.

When word line WL2n of the memory cell array 11-2 is selected, the relationship between bit lines BL0 and BL1 may be reversed.

Figure 7:
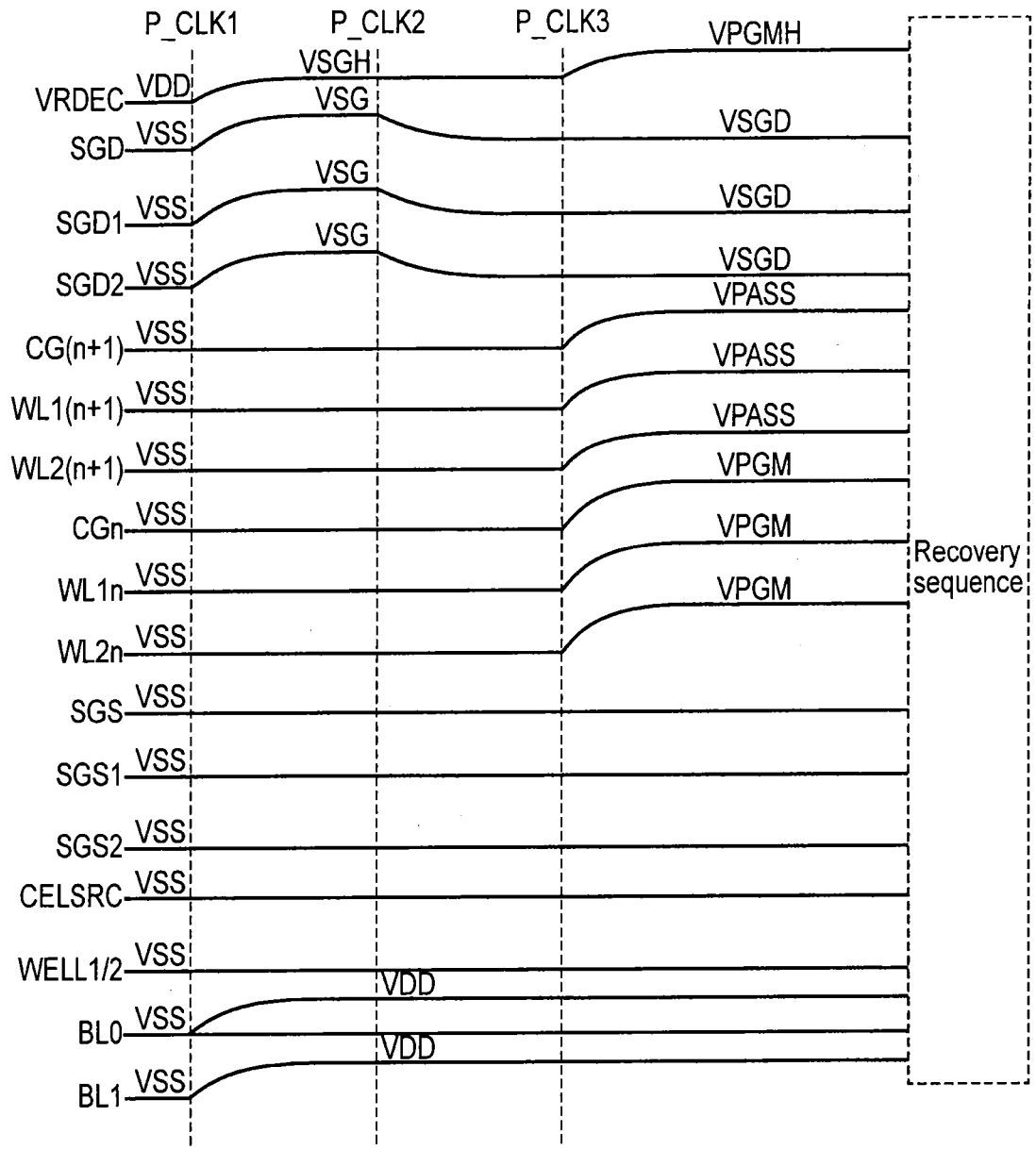
FIG. 7 is a timing diagram for illustrating the write operation.

Next, the write operation of the nonvolatile semiconductor memory device 10 is explained. FIG. 7 is a timing diagram for illustrating the write operation. It is supposed that word line WL1n of the memory cell array 11-1 of FIG. 5 is selected.

In FIG. 7 and in the following description, voltage VSGD is a voltage that enables the select transistor to transfer ground voltage VSS and power source voltage VDD, but makes the select transistor unable to transfer a voltage higher than power source voltage VDD. VPGM is a write voltage and VPASS is a non-write word line voltage that inhibits the write operation of a memory cell of a non-selected word line while write voltage VPGM is being applied to the selected word line and VPASS can make conductive the memory cell into which data is written. VSGH is a voltage that enables the transfer gate to transfer voltage VSG and VPGMH is a voltage that enables the transfer gate to transfer voltage VPGM.

When the write operation is started in response to clock P_CLK1, voltage VSGH is applied to signal line VRDEC and transfer signal line TG. As a result, all of the transfer gates connected to blocks BLK1m and BLK2m are turned on and are set in a state in which voltage VSG can be transferred. Voltage VSG is applied to select gate lines SGD1 and SGD2 and select transistors ST11 and ST12 are turned on. Then, the channel of the memory cell is charged via bit line BL. That is, in the memory cell array 11-1, the voltage of bit line BL0 is charged to ground voltage VSS or power source voltage VDD according to write data.

Specifically, when the threshold voltage of the memory cell is raised ("0" data is written to memory cell MC), bit line BL0 is charged to ground voltage VSS. As a result, a potential difference between word line WL1n and the channel becomes larger and electrons are injected into the charge storage layer of memory cell MC. Further, when the threshold voltage of the memory cell is kept, bit line BL0 is charged to power source voltage VDD. A potential difference between word line WL1n and the channel does not become sufficiently large by self-boost due to voltages VPASS and VPGM applied to the word line and memory cell MC is set in a write inhibition state. In order to set a non-write state (write inhibition state) in the memory cell array 11-2, bit line BL1 is charged to power source voltage VDD.

Then, voltage VSGD is applied to select gate lines SGD1 and SGD2 in response to clock P_CLK2 and select transistors ST11 and ST12 are cut off.

Next, voltage VPGMH is applied to signal line VRDEC and transfer signal line TG in response to clock P_CLK3. Voltage VPASS is applied to word lines WL1(n+1) and WL2(n+1) and write voltage VPGM is applied to word lines WL1n and WL2n. As a result, in the memory cell array 11-1, the write operation is performed according to the voltage of bit line BL0. In the memory cell array 11-2, the write operation is not performed since the channel of the memory cell is charged to power source voltage VDD. After this, a recovery sequence is performed.

When word line WL2n of the memory cell array 11-2 is selected, the relationship between bit lines BL0 and BL1 may be reversed.

Next, the erase operation of the nonvolatile memory device 10 is explained. FIG. 8 is a timing diagram for illustrating the erase operation. VERA is an erase voltage and is set at a voltage higher than the ground voltage.

When the erase operation is started in response to clock E_CLK1, voltage VSGH is applied to signal line VRDEC and transfer signal line TG. As a result, all of the transfer gates connected to blocks BLK1m and BLK2m are turned on and are set in a state in which voltage VSG can be transferred. Voltage VSG is applied to select gate lines SGD1 and SGS1 of the memory cell array 11-1. Since the memory cell arrays 11-1 and 11-2 are simultaneously selected, voltage VSG is also applied to select gate lines SGD2 and SGS2 of the memory cell array 11-2. Further, ground voltage VSS is applied to source line CELSRC and bit line BL0. As a result, the channel of the memory cell is discharged to ground voltage VSS.

Subsequently, erase voltage VERA is applied to well WELL1 of the memory cell array 11-1 in response to clock E_CLK2. Select gate lines SGD1 and SGS1 are set in a floating state and, as a result, select gate lines SGD1 and SGS1 are charged to erase voltage VERA by coupling with well WELL1 and the transfer gate for the select gate line is cut off. Select gate lines SGD2 and SGS2 keep voltage VSGD since well WELL2 is set at ground voltage VSS.

In this case, select gate lines SGD2 and SGS2 of the non-selected memory cell array 11-2 can be prevented from being charged to erase voltage VERA by providing transfer gates SGDSW and SGSSW for the memory cell arrays 11-1 and 11-2 (providing transfer gates SGDSW1 and SGDSW2 for select gate line SGD and providing transfer gates SGSSW1 and SGSSW2 for select gate line SGS). Since ground voltage VSS is applied to well WELL2, the select gate line may be electrically destroyed if select gate lines SGD2 and SGS2 are charged to a high voltage. Therefore, the select gate line can be prevented from being electrically destroyed by providing the transfer gates for the memory cell arrays 11-1 and 11-2. Further, ground voltage VSS is applied to word lines WL1n and WL1(n+1) of selected block BLK1m. As a result, electrons are extracted from the charge storage layers of all of memory cells MC in selected block BLK1m and data of selected block BLK1m is erased. At this time, ground voltage VSS is applied to well WELL2 of the memory cell array 11-2 to set the memory cell array 11-2 in a non-selected state.

The non-selected block of the memory cell array 11-1 is explained. Ground voltage VSS is applied as transfer signal TG from row decoder driver RDEC-DRV to the gate electrodes of the transfer gates connected to word lines WL (expressed as WLuse1) included in the non-selected block. Therefore, word line Wkuse1 is charged to erase voltage VERA by coupling with well WELL1 after ground voltage VSS is transferred. Like word line WL1 of the memory cell array 11-1, ground voltage VSS is applied to word line WL2 of the memory cell array 11-2. However, since erase voltage VERA is applied to well WELL1 of the memory cell array 11-1, the potential of word line WL1 may rise in some cases. At this time, well WELL2 of the memory cell array 11-2 is set at ground voltage VSS. As a result, there occurs a possibility that the memory cell of the memory cell array 11-2 may be erroneously written. In order to take a countermeasure against this, power source voltage VDD is applied to bit line BL1 of the memory cell array 11-2 to charge the channel of the memory cell of the memory cell array 11-2 to power source voltage VDD. Thus, in the non-selected block of the memory cell array 11-2, a potential difference between word line Wuse1 and the channel does not becomes sufficiently large and an erroneous write operation can be prevented.

When the memory cell array 11-2 is erased, the relationship between well WELL1 and well WELL2 may be reversed. Further, when the memory cell array 11-2 is erased, the relationship between bit line BL1 and bit line BL2 may be reversed.

[3. Comparison Example]

Figure 9:
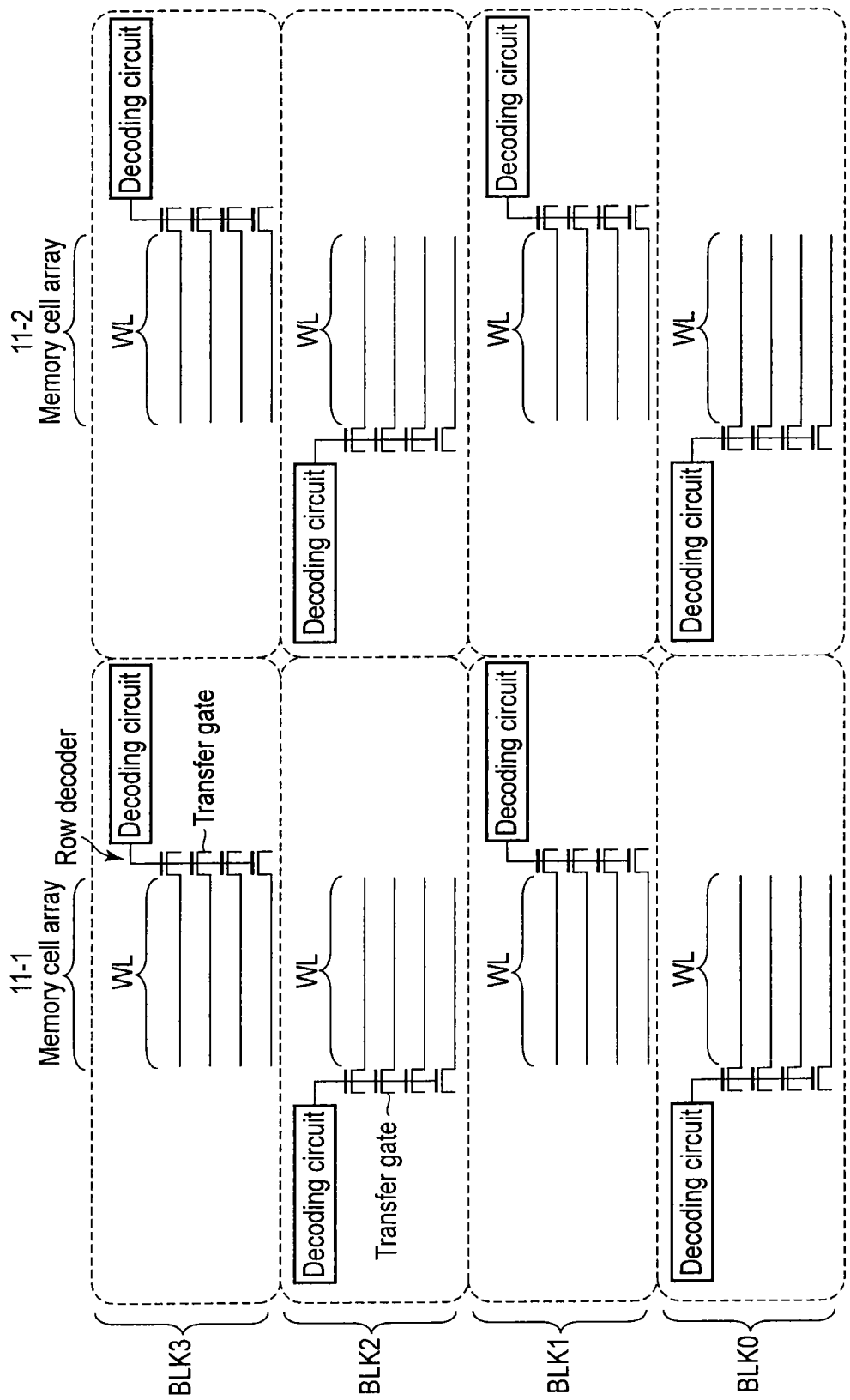
FIG. 9 is a schematic diagram showing the configuration of row decoders according to a comparison

As a comparison example, a case wherein row decoders are arranged in the memory cell arrays 11-1 and 11-2 is considered. FIG. 9 is a schematic diagram showing the configuration of row decoders according to the comparison example. The row decoder includes transfer gates connected to the respective word lines and a decoding circuit provided in each block.

In the comparison example of FIG. 9, four decoding circuits for the four blocks of the memory cell array 11-1 are alternately arranged on the right and left sides of the memory cell array 11-1 and four decoding circuits for the four blocks of the memory cell array 11-2 are alternately arranged on the right and left sides of the memory cell array 11-2. Further, each decoding circuit is connected to the transfer gates corresponding in number to all of word lines WL in one block.

When FIG. 9 (comparison example) and FIG. 4 (present embodiment) are compared, the four decoding circuits (that is, decoding circuits of two columns) and transfer gates of two blocks (that is, transfer gates of one column) can be reduced in this embodiment in comparison with the comparison example.

[4. Effect]

As described above in detail, in this embodiment, the nonvolatile semiconductor memory device 10 includes the two memory cell arrays 11-1 and 11-2 and the row decoders 12-1 to 12-3 that control voltages of a plurality of word lines WL arranged in the memory cell arrays 11-1 and 11-2. The row decoders 12-1 to 12-3 include a plurality of transfer gates SW that transfer various voltages to word lines WL arranged in the memory cell arrays 11-1 and 11-2. Further, word lines WL arranged in the first block of the memory cell array 11-1 are divided into first and second groups, and likewise, word lines WL arranged in the second block of the memory cell array 11-2 are divided into third and fourth groups. The first and third groups commonly use transfer gates SW.

Therefore, according to this embodiment, the circuit area of the row decoders 12-1 to 12-3 can be reduced and, as a result, the circuit area of the nonvolatile semiconductor memory device 10 can be reduced. Further, since only one decoding circuit 21 is disposed for one block BLK of the memory cell array 11-1 and one block BLK of the memory cell array 11-2, the circuit area of the row decoders 12-1 to 12-3 can be further reduced.

The number of interconnections that connect the transfer gates with drivers DRV can be reduced. Specifically, in FIG. 2, the interconnections that connect transfer gates WL0SW1 to WL3SW1 included in the row decoder 12-1 to drivers WL0-DRV to WL3-DRV and the interconnections that connect transfer gates WL0SW2 to WL3SW2 included in the row decoder 12-3 to drivers WL0-DRV to WL3-DRV can be commonly used by the memory cell array 11-1 and memory cell array 11-2. Further, the interconnections that connect transfer gates WL4SW to WL7SW included in the row decoder 12-2 to drivers WL4-DRV to WL7-DRV can be commonly used by the memory cell arrays 11-1 and 11-2. Thus, the circuit area of the nonvolatile semiconductor memory device 10 can be further reduced.

Also, half of the word lines of one block arranged on one side of the memory cell array per two blocks BLK are connected to the transfer gates. As a result, a margin in the pitch of interconnections that connect the transfer gates with the word lines can be doubled when the transfer gates are connected to the word lines on one side of the memory cell array. As the transfer gate, a MOSFET formed with large size to transfer a high voltage is used. However, occurrence of a short circuit between the interconnections caused by shrinking of the nonvolatile semiconductor memory device 10 can be suppressed by applying the structure of this embodiment.

Particularly, as shown in FIG. 10, MOSFETs for transfer gates can be arranged in bit line direction BLD to be put in the width of one block. In FIG. 10, two element regions AA are arranged in bit line direction BLD to be surrounded by element isolation region STI. Gate electrode GD extending in bit line direction BLD in connection with the two element regions is arranged. Contacts CNT are respectively arranged on element regions AA on both sides of gate electrode GD. That is, two MOSFETs for transfer gates are arranged side by side in bit line direction BLD.

Gate electrode GD is connected to level shifter LS. One of contacts CNT arranged on element regions AA is connected to word lines WL1 and WL2. The other contact CNT is connected to word line driver WL-DRV.

If MOSFETs for transfer gates cannot be put in the width of one block in bit line direction BLD, it becomes necessary to arrange MOSFETs for transfer gates not only in bit line direction BLD but also in word line direction WLD. As a result, it is understood that the arrangement of interconnections for contacts CNT and word lines WL becomes complicated.

In this embodiment, the number of MOSFETs for transfer gates arranged in one row decoder 12 can be reduced. Further, since a MOSFET formed with large size to transfer a high voltage is used as the transfer gate, it is difficult to shrink the transfer gate. As a result, even if the distance between word lines WL is reduced due to shrinking, MOSFETs for transfer gates can be arranged in the width of one block in bit line direction BLD.

Further, in this embodiment, block BLK of the memory cell array 11-1 and block BLK of the memory cell array 11-2 are simultaneously selected. However, erroneous writing to the memory cell array 11-2 can be prevented by performing the voltage control operation for bit lines BL of the memory cell array 11-2 as explained in the embodiment while data is being written to block BLK of the memory cell array 11-1. The same is applied to the data read operation and erase operation.

In this embodiment, the nonvolatile semiconductor memory device 10 has the structure including the memory cell arrays 11-1 and 11-2. However, this embodiment can be applied to a case wherein three or more memory cell arrays are provided. Word lines WL of one block BLK are divided into two groups, but can be divided into three or more groups.

Further, this embodiment can be generally applied to any nonvolatile semiconductor memory device having the same row decoders as those explained above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell array comprising a first block that comprises memory cells;
a second memory cell array comprising a second block that comprises memory cells;
word lines arranged in the first and second memory cell arrays; and transfer gates configured to transfer voltages to the word lines;
wherein:
word lines arranged in the first block comprise first and second groups,
word lines arranged in the second block comprise third and fourth groups,
the transfer gates comprise first transfer gates, second transfer gates, and third transfer gates,
the first and third groups commonly use the first transfer gates,
the second transfer gates are connected to the second group and are not connected to the fourth group,
the third transfer gates are connected to the fourth group and are not connected to the second group;
the word lines in the first block are connected to the first memory cells,
the first memory cells are serially connected,
the word lines in the second block are connected to second memory cells, and
the second memory cells are serially connected.

2. The device of claim 1, wherein:
the first transfer gates are arranged between the first and second memory cell arrays,
the second transfer gates are arranged on a side opposite to the first transfer gates with respect to the first memory cell array, and
the third transfer gates are arranged on a side opposite to the first transfer gates with respect to the second memory cell array.

3. The device of claim 1, further comprising
a decoding circuit configured to simultaneously select the transfer gates connected to the first and second blocks.

4. The device of claim 2, further comprising
a driver configured to apply voltages of the word lines to the transfer gates according to an operation mode, wherein the driver supplies the same signal to gate electrodes of the first to third transfer gates.

5. The device of claim 1, further comprising:
a first bit line connected to the first block;
a second bit line connected to the second block; and
a control circuit configured to apply an erase voltage to a first well in which the first block is formed when data is erased from the first block, wherein the control circuit applies a ground voltage to a second well in which the second block is formed when data is erased from the first block.

6. The device of claim 5, wherein the control circuit applies a first voltage to the first bit line and applies a second voltage that is higher than the first voltage to the second bit line when data is erased from the first block.

7. The device of claim 1, further comprising:
a first bit line connected to the first block;
a second bit line connected to the second block; and
a control circuit configured to sense a voltage of the first bit line when data is read from the first block, wherein the control circuit applies a ground voltage to the second bit line when data is read from the first block.

8. The device of claim 7, further comprising:
a first sense amplifier connected to the first bit line; and
a second sense amplifier connected to the second bit line, wherein the second sense amplifier is deactivated when data is read from the first block.

9. The device of claim 1, further comprising:
a first bit line connected to the first block;
a second bit line connected to the second block; and
a control circuit configured to apply one of a ground voltage and power source voltage to the first bit line according to data when data is written to the first block, wherein the control circuit applies the power source voltage to the second bit line to set the second block in a write inhibition state when data is written to the first block.

10. The device of claim 9, wherein the control circuit applies the ground voltage to the first bit line when data is written to the first block.

11. The device of claim 1, wherein:
the first memory cell array comprises first blocks, and
the second memory cell array comprises second blocks.

12. The device of claim 11, further comprising
a decoding circuit configured to simultaneously select transfer gates connected to a pair of first and second blocks.

13. The device of claim 12, wherein the decoding circuits are alternately arranged on both sides of the first and second memory cell arrays.

14. The device of claim 1, wherein each of the first and second memory cell arrays is a NAND flash memory.

15. The device of claim 1 that is a non-volatile semiconductor memory device.

16. The device of claim 1 that is a non-volatile semiconductor memory device that comprises a plurality of memory cell arrays, wherein the memory cell arrays comprise a plurality of memory cells arranged in matrix form and includes a rewritable EEPROM ("Electrically Erasable Programmable Read-Only Memory") cell.

* * * * *